United States Patent [19]
Smith

[11] Patent Number: 5,091,700
[45] Date of Patent: Feb. 25, 1992

[54] AMPLIFIER WITH MAINS VOLTAGE REDUCTION

[76] Inventor: Randall C. Smith, 1317 Ross St., Petaluma, Calif. 94952

[21] Appl. No.: 566,148

[22] Filed: Aug. 10, 1990

[51] Int. Cl.$^5$ .............................................. H03F 1/00
[52] U.S. Cl. ................................... 330/128; 330/202; 381/118; 381/120
[58] Field of Search .................. 330/123, 128, 202; 381/118, 120, 121

[56] References Cited

U.S. PATENT DOCUMENTS

| | | | |
|---|---|---|---|
| 2,082,478 | 6/1937 | Beers | 330/128 X |
| 4,211,893 | 7/1980 | Smith | 330/149 X |
| 4,701,957 | 10/1987 | Smith | 381/61 |
| 4,713,624 | 12/1987 | Smith | 330/118 |

*Primary Examiner*—James B. Mullins
*Attorney, Agent, or Firm*—David B. Harrison

[57] ABSTRACT

A method enables a musician to reduce the voltage level between a nominal level which is supplied to power an audio power amplifier including at least one vacuum tube power output device and a reduced level, by controlling AC input voltage level of an AC to DC power supply via an input transformer having a primary winding connected to receive nominal AC voltage from the AC power mains, a high voltage secondary, and a low voltage secondary for directly supplying heater power to the vacuum tube power output device. The method comprising the steps of: overwinding the primary winding of the input transformer with respect to the AC voltage level of the supply mains, providing a tap in the overwound primary at a location which corresponds generally to the AC voltage level of the supply mains, and providing a switching means for switching between the tap corresponding to the AC voltage level of the supply mains to provide nominal full power supply to the audio power amplifier to achieve nominal sound reproduction characteristics during musical play, and the full winding of the overwound primary in order to provide a fraction of the AC voltage level of the supply mains to provide reduced power supply to the audio power amplifier to achieve altered sound reproduction characteristics during musical play.

3 Claims, 2 Drawing Sheets

5,091,700

AMPLIFIER WITH MAINS VOLTAGE REDUCTION

FIELD OF THE INVENTION

The present invention related to a power amplifier for musical subject matter. More particularly, the present invention relates to an amplifier apparatus providing for the reduction of power supply voltages to enhance guitar playing.

BACKGROUND OF THE INVENTION

In the domain of electric musical instrument amplification, especially that which is particularly directed toward guitar, enhanced performance characteristics can be found in quite unexpected places. This is due to several factors: first, the guitar can be played as a rhythm instrument producing several notes simultaneously (chords), or as a solo instrument where lead lines are typically one note at a time. Two entirely different types of amplifier responses are required to properly do justice to these two types of playing. This area alone is the subject of much prior art including the following patents by the present inventor: U.S. Pat. Nos. 4,211,893; 4,701,957 and others. A second reason why amplifying apparatus for guitar is a fertile field for unusual discoveries is that several different styles of music are playable by guitar: blues, rock, fusion, metal, pop, and country to name just the easily identifiable styles. Within these styles, efforts are often made by musicians to duplicate or recreate certain timbres, sometimes of vintage heritage and produced by very old electric instruments and amplifiers which are no longer available. A final reason for the diversity of the field is the intimate relationship enjoyed by the accomplished player between the auditory sensation of "playing" and the tactile performance of "playing". Anything which can enhance the "chemistry" of this activity where electronics provide the connection between the ear and the hands is necessarily valid, even though to one unskilled in the art, such electronic enhancements may seem strange indeed.

SUMMARY OF THE INVENTION WITH OBJECTS

This invention is very simple. It comprises a specially modified power transformer and AC mains switching device which enable the musician to select between "normal" operation and "reduced voltage" operation. In the normal position, the power transformer primary winding receives the input voltage it was nominally designed to handle, namely 117 volts (approximately) in the United States. Secondary voltages then, are as the designer intended. In the preferred embodiment of the present invention however, the primary winding has been extended by approximately 25 percent beyond the point where the turns ratio equals the nominal 117 volts. Thus, when the actual line voltage is impressed across the entire winding, the effect on the secondary side of the transformer is as though a severe "brown out" is occurring, and approximately 90 volts or less are available at the AC wall socket. Strange as it may sound, this causes some very noticeable—and favorable—effects which are the objects of the present invention. Dynamic response of the amplifier is altered resulting in a "spongy, cushioned" feeling at the guitar strings. This feeling alone causes most musicians to feel a "boost in confidence" as response is now very "forgiving" of minor playing inaccuracies by blurring over such inaccuracies resulting in a softer, less focused sound. Furthermore, saturation clipping obviously occurs much more readily and this, as is well shown in the prior preamplifier art mentioned earlier, is the single most important characteristic for enhancing solo playing—or any playing for that matter—where distortion is desirable. Not only does saturation distortion occur more readily throughout the amplifier, but the characteristics are altered: they are softened. The typical pentode characteristic where onset of clip occurs very abruptly is modified and extended. Because the dynamic range is reduced and the onset of clip softened and extended, the player can work expressively within an area between the threshold of clip and substantial saturation. In this dynamic range the well designed amplifier produces distortion characteristics which are "touch sensitive" to picking dynamics and which provide harmonics that "stay glued" to the note and give added expression, totally unlike distortion in the obnoxious sense of "turning the radio too loud".

Further objects of the present invention include dramatically extended vacuum tube life and component reliability. Most tube amplifiers for guitars run the tubes under more demanding conditions than would be typical of conventional consumer or commercial electronics and, with the increasing difficulty of procuring high quality tubes, the reduced-voltage amplifier promises much greater reliability while still offering performance levels entirely adequate for a large variety of typical applications: most notably, small live venues and studio recording performances. When circumstances require maximum power, the musician has only to alter the setting of the A.C. power switch.

An unexpected and important further object of the present invention is its ability to enable the amplifier to resume performing even after serious output tube failure has occurred. This is of obvious importance to the musician for whom "getting through the job" is of paramount importance. When vacuum tube power devices fail in operation, they typically experience run-away plate current draw while the electron flow is internally "shorted". Removing the high voltage (which will probably occur as a result of fusing), then reapplying reduced operating voltages by means of the extended A.C. primary will nearly always enable the faulty tube to return to normal—albeit reduced voltage—operation for several hours.

For the player seeking to recreate more exactly the sounds and feelings of certain vintage recordings, the reduced voltage amplifier is a major asset. The roots of modern blues and rock occurred in largely spontaneous atmospheres where the technical standards of electronic performance were "woefully inadequate". And yet it can be persuasively argued that some of these technical inadequacies were heavy contributors to the "magic" of these performances. While the present inventor makes no claim of expertise in American ethno-musicology relating to early blues and rock performances, he has measured AC mains voltages in "funky" club settings and, during very eventfully, emotional performances discovered that those voltages hover in the high eighties—low nineties range. (The kinds of inadequate wiring that leads to these conditions is, of course, the fire marshall's nightmare!) But afterward, when inquiring of the musicians how their amplifiers were performing during these episodes, their response was usually ecstatic. Therefore another object of the reduced voltage amplifier, is to enable the musician to safely recreate these aesthetically desirable amplification conditions on demand.

A final object of the present invention is that it enables the musician to substitute different types of output tubes (each with its own unique sonic characteristics) and safely operate them without requiring internal alterations. A typical example would be the replacement of the standard 6L6 with smaller type 6V6 whose maximum safe operating voltages approximate those conditions produced by mains voltage reduction.

Those skilled in the art will recognize that there are methods other than those described in the Preferred Embodiment described below by which similar results could be achieved. One would be the use of switchable secondary voltages, although this would require switching devices of increased complexity. An alternate method would be the use of a voltage reduction resistor network on either the primary or secondary side of the transformer. Here again, the drawbacks are equally obvious to one skilled in the art.

DETAILED DESCRIPTION OF PREFERRED EMBODIMENTS

Figure 1:
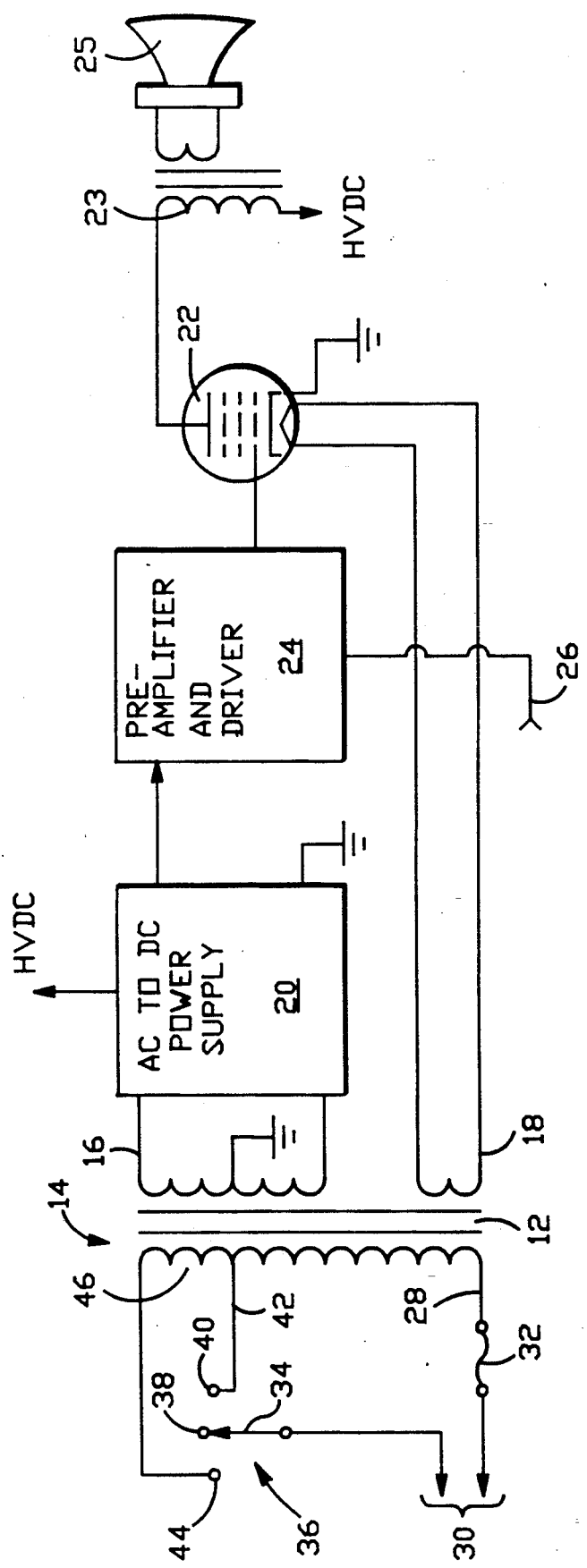
FIG. 1 is a block diagram of a musical performance amplifier including at least one output vacuum tube and including a schematic representation of a vacuum tube amplifier power transformer showing the extended primary winding for reduced voltage operation plus nominal 117 volt tap and power switch.

In FIG. 1, a musical amplifier 10 includes a power transformer 12 including a tapped primary winding 14, a centertapped secondary winding 16 and a filament winding 18. The centertapped secondary winding 16 leads to an AC to DC power supply 20 which supplies operating voltages throughout the amplifier 10 including screen element voltage and plate voltage to a vacuum tube power output amplifier 22 through an output transformer 23 leading to a loudspeaker device 25. A preamplifier and driver circuit 24 includes an audio input 26 for connection to a musical instrument audio output source, such as a variable reluctance pickup of an electric guitar for example.

The power transformer primary winding 14 is connected at its "hot" end 28 to the 117 volt A.C. mains supply 30 through a fuse element 32. The neutral leg of A.C. mains supply 30 is connected to a center pole 34 of a single pole double throw switch 36, which is configured with a center-off position 38. When contact is made via the center pole 34 to pole 40, normal voltage operation tap 42 is selected. The normal operation tap 42 on the transformer primary 14 is located at a point corresponding to nominal AC mains supply voltage, e.g. 117 volts, thereby causing nominal voltages to appear at the heater secondary 18 as well as the high-voltage secondary 16.

Reduced voltage operation occurs when the power switch 36 connects A.C. neutral of the mains 30 to an extended primary winding 46 via a pole 44 causing a decrease of approximately 25 percent in the A.C. voltages present on the secondary windings 16 and 18.

Figure 2:
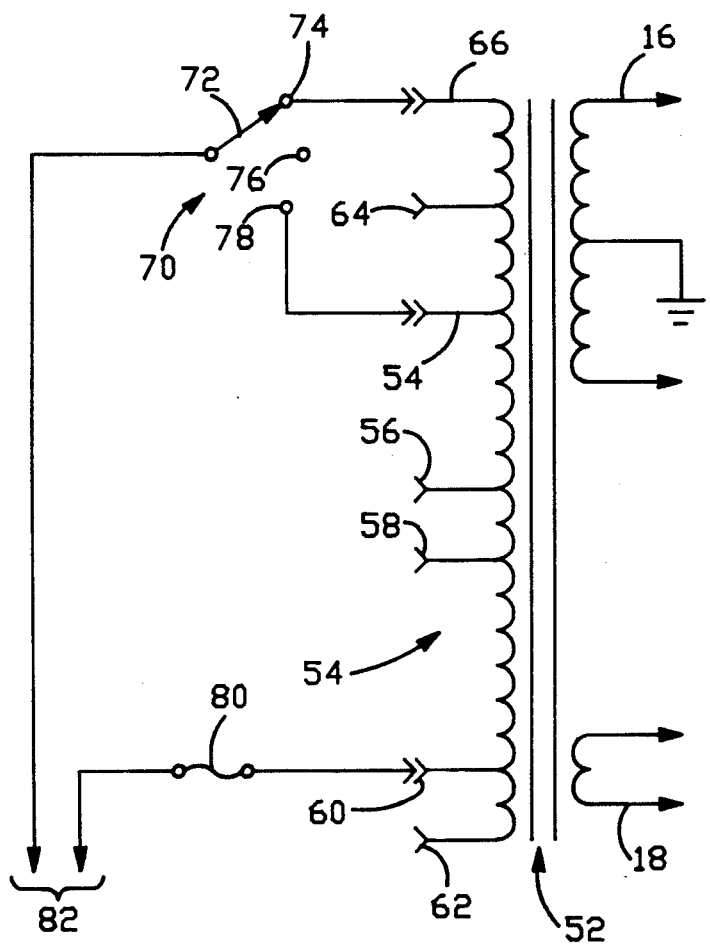
FIG. 2 is a schematic representation of the vacuum tube amplifier power transformer and switch as configured for "all world" multi-voltage conditions.

In FIG. 2, a universal transformer 52 which may be substituted for the transformer 12 in FIG. 1, includes a primary winding 54 which is provided with taps 56, 58, 60, 62, 64, and 66. The tap 54 is a zero voltage or reference tap. Tap 56 is for 100 volts as found in Japan, tap 58 for 117 volts for U.S.A. and Canada, tap 60 for 220 volts for European continent and tap 62 for 240 volts for United Kingdom including Australia. Connection of an A.C. hot lead to a desired voltage tap may be made internally or through a user-selective switch. In FIG. 2, the A.C. hot line shown from mains 82 is connected at tap 60 through a fuse element 80. A power switch 70 is again a single-pole-double-throw type switch with a center Off position 76. When a wiper 72 of the switch 70 contacts a pole 78 leading to the neutral or reference tap 54, it can be seen that the A.C. neutral from mains 82 is thereby connected to the reference tap 54 of the transformer primary 54, and nominal voltages are achieved at the secondary windings 16 and 18. Two tapped extensions are made to the primary winding 54 so as to accommodate the dual voltage ranges. Because the amount of voltage reduction does not need to be exact, the tap 64 can be used with either 100 or 117 volt service. And, similarly, the tap 66 is used to connect to a pole 74 of the switch 72 when A.C. mains are either 220 or 240 volts and a connection is made to the tap 60 (as shown in FIG. 2) or to tap 62.

The apparatus and method shown and described herein are illustrative of the principle of the invention and are not meant to be limiting of its scope. Various other embodiments will be apparent to those skilled in the art and may be made without departing from the spirit and scope of the invention as defined by the following claims:

What is claimed is:

1. A method for enabling a musician to reduce the power an audio power amplifier including at least one vacuum tube power output device and a reduced level, by controlling AC input voltage level of an AC to DC power supply via an input transformer having a primary winding connected to receive nominal AC voltage from the AC power mains, a high voltage secondary, and a low voltage secondary for directly supplying heater power to the vacuum tube power output device, the method comprising the steps of:

overwinding the primary winding of the input transformer with respect to the AC voltage level of the supply mains, providing a tap in the overwound primary at a location which corresponds generally to the AC voltage level of the supply mains, and providing a switching means for switching between the tap corresponding to the AC voltage level of the supply mains to provide nominal full power supply to the audio power amplifier to achieve nominal sound reproduction characteristics during musical play, and the full winding of the overwound primary in order to provide a fraction of the AC voltage level of the supply mains to provide reduced power supply to the audio power amplifier to achieve altered sound reproduction characteristics during musical play.

2. The method set forth in claim 1 wherein the step of overwinding the primary winding is carried out by the step of overwinding the primary by approximately twenty five percent of the nominal AC voltage level of the supply mains.

3. The method set forth in claim 1 comprising the further step of providing a plurality of additional selectable taps at the primary in order to enable selection of taps for a plurality of mains supply voltages.

* * * * *